United States Patent
Manning

(10) Patent No.: US 6,393,378 B2
(45) Date of Patent: *May 21, 2002

(54) CIRCUIT AND METHOD FOR SPECIFYING PERFORMANCE PARAMETERS IN INTEGRATED CIRCUITS

(75) Inventor: Troy A. Manning, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/764,535

(22) Filed: Jan. 16, 2001

Related U.S. Application Data

(63) Continuation of application No. 09/036,700, filed on Mar. 6, 1998, now Pat. No. 6,212,482.

(51) Int. Cl.$^7$ .................................. G06F 11/30
(52) U.S. Cl. ................ 702/182; 365/230.3; 365/230.05
(58) Field of Search ................ 702/120, 182; 365/230.05, 230.06, 230.03; 327/295, 292, 415

(56) References Cited

U.S. PATENT DOCUMENTS

| | | | |
|---|---|---|---|
| 4,459,660 A | 7/1984 | Bellay et al. ............... | 364/200 |
| 4,508,569 A | 4/1985 | Allgood et al. ............. | 307/577 |
| 4,689,494 A | 8/1987 | Chen et al. ............... | 307/202.1 |
| 4,714,839 A | 12/1987 | Chung ........................ | 307/441 |
| 4,720,817 A | 1/1988 | Childers .................... | 365/200 |
| 4,801,992 A | 1/1989 | Golubic ....................... | 357/40 |
| 4,843,188 A | 6/1989 | Patterson et al. .......... | 174/52.4 |
| 4,958,088 A | 9/1990 | Farah-Bakhsh et al. ..... | 307/443 |
| 5,075,569 A | 12/1991 | Branson ..................... | 307/270 |
| 5,097,157 A | 3/1992 | Jaffe et al. .................. | 307/530 |
| 5,164,619 A | 11/1992 | Luebs ........................ | 307/480 |
| 5,216,297 A | 6/1993 | Proebsting ................. | 307/475 |
| 5,239,206 A | 8/1993 | Yanai ....................... | 307/272.2 |

(List continued on next page.)

FOREIGN PATENT DOCUMENTS

| | | |
|---|---|---|
| WO | WO 95/22064 | 8/1995 |
| WO | WO 95/32549 | 11/1995 |

OTHER PUBLICATIONS

Chapman, J. et al., "A Low–Cost High–Performance CMOS Timing Vernier for ATE", IEEE International Test Conference, Paper 21.2, 1995, pp. 459–468.

Satoru Tanoi, Member, IEEE, Tetsuya Tanabe, Kazuhiko Takahashi, Sanpei Miyamoto and Masaru Uesugi, "A 250–622 MHz Deskew and Jitter–Suppressed Clock Buffer Using Two–Loop Architecture," IEICE Trans, Electron, vol. E79 C., No. 7, July 1996.

Descriptive literature entitled, "400 MHz SLDRAM, 4M X 16 SLDRAM Pipelined, Eight Bank, 2.5 V Operation," SLDRAM Consortium Advance Sheet, published thoughout the United States, pp.1–22.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

*Primary Examiner*—Kamini Shah
(74) *Attorney, Agent, or Firm*—Dorsey & Whitney LLP

(57) ABSTRACT

A method and circuit for recording the performance parameters in an integrated circuit. A speed grade register is programmed by the manufacturer with an indication of the speed capability of the integrated circuit. The integrated circuit also includes a clock speed register that is programmed by the user with an indication of the frequency of a clock signal that will be used to synchronize the operation of the integrated circuit. The speed grade and clock speed indications are used to select a set of performance data from a performance data register to provide an indication of the performance of the integrated circuit at the indicated speed grade and clock speed.

59 Claims, 3 Drawing Sheets

U.S. PATENT DOCUMENTS

| | | | |
|---|---|---|---|
| 5,248,946 A | 9/1993 | Murakami et al. | 330/253 |
| 5,272,729 A | 12/1993 | Bechade et al. | 375/118 |
| 5,278,460 A | 1/1994 | Casper | 307/296.5 |
| 5,295,102 A | 3/1994 | McClure | 365/200 |
| 5,311,081 A | 5/1994 | Donaldson et al. | 307/475 |
| 5,361,002 A | 11/1994 | Casper | 327/530 |
| 5,389,834 A | 2/1995 | Kinugasa et al. | 326/21 |
| 5,412,593 A | 5/1995 | Magel et al. | 365/96 |
| 5,422,529 A | 6/1995 | Lee | 327/536 |
| 5,430,408 A | 7/1995 | Ovens et al. | 327/404 |
| 5,432,823 A | 7/1995 | Gasbarro et al. | 375/356 |
| 5,442,589 A | 8/1995 | Kowalski | 365/225.7 |
| 5,448,187 A | 9/1995 | Kowalski | 326/81 |
| 5,451,898 A | 9/1995 | Johnson | 327/563 |
| 5,455,798 A | 10/1995 | McClure | 365/200 |
| 5,465,060 A | 11/1995 | Pelella | 327/51 |
| 5,488,321 A | 1/1996 | Johnson | 327/66 |
| 5,491,664 A | 2/1996 | Phelan | 365/200 |
| 5,495,436 A | 2/1996 | Callahan | 365/96 |
| 5,526,312 A | 6/1996 | Eltoukhy | 365/201 |
| 5,528,539 A | 6/1996 | Ong et al. | 365/200 |
| 5,539,333 A | 7/1996 | Cao et al. | 326/63 |
| 5,563,546 A | 10/1996 | Tsukada | 327/408 |
| 5,570,042 A | 10/1996 | Ma | 326/63 |
| 5,572,458 A | 11/1996 | Smith et al. | 365/96 |
| 5,572,476 A | 11/1996 | Eltoukhy | 365/210 |
| 5,574,729 A | 11/1996 | Kinoshita et al. | 371/10.3 |
| 5,577,050 A | 11/1996 | Bair et al. | 321/10.2 |
| 5,578,941 A | 11/1996 | Sher et al. | 326/34 |
| 5,602,786 A | 2/1997 | Pascucci et al. | 365/200 |
| 5,617,365 A | 4/1997 | Horiguchi et al. | 365/200 |
| 5,621,340 A | 4/1997 | Lee et al. | 327/65 |
| 5,625,805 A | 4/1997 | Fenwick et al. | 395/558 |
| 5,654,658 A | 8/1997 | Kubota et al. | 327/202 |
| 5,659,509 A | 8/1997 | Golla et al. | 365/200 |
| 5,663,915 A | 9/1997 | Mobley | 365/208 |
| 5,666,067 A | 9/1997 | Sher et al. | 326/34 |
| 5,668,492 A | 9/1997 | Pedersen et al. | 327/291 |
| 5,691,945 A | 11/1997 | Liou et al. | 365/200 |
| 5,706,292 A | 1/1998 | Merritt | 371/10.2 |
| 5,734,617 A | 3/1998 | Zheng | 365/225.7 |
| 5,736,882 A | 4/1998 | Witte | 327/259 |
| 5,748,020 A | 5/1998 | Mactaggart et al. | 327/218 |
| 5,757,705 A | 5/1998 | Manning | 365/201 |
| 5,757,711 A | 5/1998 | Nakaoka et al. | 365/207 |
| 5,781,486 A | 7/1998 | Merritt | 365/201 |
| 5,790,462 A | 8/1998 | McClure | 365/200 |
| 5,809,225 A | 9/1998 | Ohsawa et al. | 395/183.08 |
| 5,850,150 A | 12/1998 | Mitra et al. | 326/16 |
| 5,852,378 A | 12/1998 | Keeth | 327/171 |
| 5,875,144 A | 2/1999 | Zheng | 365/225.7 |
| 5,898,287 A | 4/1999 | Roberti et al. | 318/605 |
| 5,898,297 A | 4/1999 | Bosnyak et al. | 323/315 |
| 5,901,105 A | 5/1999 | Ong et al. | 365/230.06 |
| 5,915,105 A | 6/1999 | Farmwald et al. | 395/309 |
| 5,953,276 A | 9/1999 | Baker | 365/208 |
| 5,978,298 A | 11/1999 | Zheng | 365/225.7 |
| 6,011,742 A | 1/2000 | Zheng | 365/225.7 |
| 6,026,051 A | 2/2000 | Keeth et al. | 365/233 |
| 6,069,510 A | 5/2000 | Keeth | 327/170 |
| 6,104,209 A | 8/2000 | Keeth et al. | 326/83 |

| $A_1$ | $A_0$ | Speed Grade |
|---|---|---|
| 0 | 0 | 30ns |
| 0 | 1 | 35ns |
| 1 | 0 | 40ns |
| 1 | 1 | 45ns |
*Fig. 3A*
| $A_3$ | $A_4$ | Clock Speed |
|---|---|---|
| 0 | 0 | 200 MBPS |
| 0 | 1 | 400 MBPS |
| 1 | 0 | 600 MBPS |
| 1 | 1 | 800 MBPS |
*Fig. 3B*
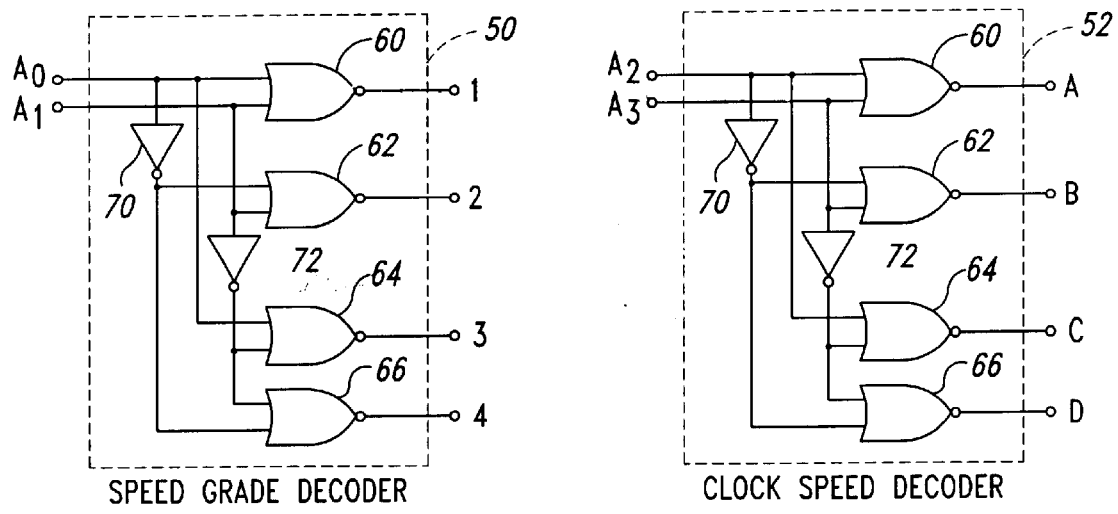
*Fig. 4*
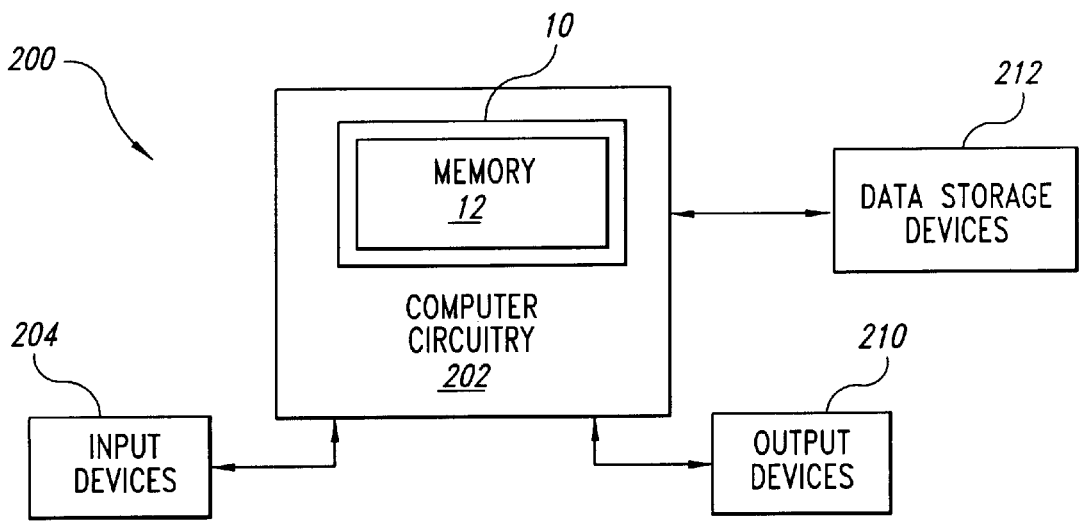
*Fig. 6*

CIRCUIT AND METHOD FOR SPECIFYING PERFORMANCE PARAMETERS IN INTEGRATED CIRCUITS

CROSS-REFERENCE TO RELATED APPLICATION

This application is a continuation of pending U.S. patent application Ser. No. 09/036,700, filed Mar. 6, 1998, Now U.S. Pat. No. 6,212,482.

TECHNICAL FIELD

This invention relates to integrated circuits, and, more particularly, to a circuit and method for recording respective sets of performance parameters for integrated circuits.

BACKGROUND OF THE INVENTION

Integrated circuits are commonly used in a wide variety of fields. For example, integrated circuit dynamic random access memories ("DRAMs") are commonly used in computer systems and other devices. Interfacing integrated circuits, such as DRAMs, to other components can be a complex task, particularly when one is attempting to operate the integrated circuit at maximum performance. To assist in the design of electronic systems using integrated circuits, integrated circuit manufacturers publish data books or data sheets that specify the performance parameters of the integrated circuits. For example, a data sheet for a DRAM may specify an access time, i.e., the time required for valid data to be presented to the data bus after an address has been applied to the device, an address hold time, i.e., the time that an address must be present on the address bus after an address strobe signal, and a large number of other timing parameters. Although timing parameters are generally specified as times or ranges of times, e.g., microseconds and nanoseconds, they may also be specified in terms of numbers of clock cycles. For example, the read latency of a memory device may be specified as a number of clock cycles between addressing the memory device and the availability of data from the addressed location on the data bus.

When specifying timing and other performance parameters, manufacturers will normally use a conservative approach. More specifically, the actual performance capabilities of integrated circuits will generally vary over a significant range or a variety of reasons, such as process variations. The performance parameters for the integrated circuits will generally be specified at values that are sufficiently conservative for substantially all of the integrated circuits to fall within the specified range of performance capabilities. However, most of the integrated circuits are actually capable of performing at a significantly higher level. As a result, many integrated circuits are sold as relatively low performance devices at a relatively low price even thought they actually perform at a significantly higher level and could be sold at a significantly higher price.

One approach to specifying the performance parameters of integrated circuits in a more advantageous manner is to "speed grade" the integrated circuits after manufacture. In speed grading, integrated circuits with a relatively broad range of performance values are tested and then grouped according to their performance during testing. Integrated circuits that are found to perform at a higher speed are specified with more stringent time parameters, while integrated circuits that are capable of operating only at slower speeds are specified at less stringent parameters. Using this speed grading approach, the same integrated circuits manufactured in the same process will have different performance specifications. However, all of the integrated circuits can be sold at a price commensurate with their actual performance.

Although speed grading allows integrated circuits to be used at their highest potential, there are nevertheless problems incurred using this approach. First, it may be difficult for a user or system designer to determine the performance parameters that are associated with any particular integrated circuit. Generally, the performance parameters for various speed grades are specified in a data book in the same manner that performance parameters are specified for non-speed graded integrated circuits. A marking on an external surface of the integrated circuit identifies its speed grade. The performance parameters for the integrated circuit are then determined by looking up the performance parameters in the data book that correspond to the speed grade marked on the integrated circuit. Unfortunately, users may not always have an up-to-date data book available. Also, the speed grade markings on the integrated circuit can become obliterated. Under these circumstances, it may not be possible to determine the performance parameters of the integrated circuit.

Another problem in speed grading integrated circuits results from the difficulty in specifying performance parameters under circumstances where the performance parameters vary depending upon the frequency of a clock signal used to synchronize the operation of the integrated circuit. To determine the performance parameters of an integrated circuit operating in synchronism with a clock signal of a predetermined frequency, different sets of performance parameters are specified for respective clock frequencies. Again, however, it is necessary for the user to find the appropriate set of performance parameters in the data book to determine the performance parameters of the integrated circuit operating at the chosen clock frequency.

There is therefore a need for an improved technique for determining the performance parameters of an integrated circuit, particularly where the integrated circuit is to be operated at optimum performance at a clock frequency that can be chosen by the user of the integrated circuit.

SUMMARY OF THE INVENTION

According to one aspect of the invention, performance parameters for an integrated circuit are recorded in the integrated circuit itself so that they can be subsequently read or otherwise used during the operation of the integrated circuit. The integrated circuit may include any of a variety of functional circuits, such as memory devices. The integrated circuit may include a speed grade register that is programmable by the integrated circuit manufacturer after testing the integrated circuit to specify the speed performance capability of the integrated circuit. In addition to, or as an alternative to, the speed grade register, the integrated circuit may include a clock speed register programmable by a user of the integrated circuit to specify the frequency of a clock signal that will be applied to the integrated circuit during use. A plurality of sets of performance parameters for the integrated circuit are recorded in a performance data recording circuit within the integrated circuit. A set of performance parameters are specified for each of a plurality of speed grades and/or each of a plurality of frequencies of the clock signal. A performance data selecting circuit selects one of the sets of recorded performance parameters as a function of the programming of the speed grade register and/or the programming of the clock speed register. The speed grade register and the clock speed register may each comprises a plurality of programmable elements, such as anti-fuses, having respective conductive states. The performance data recording circuit preferably includes a plurality of performance data registers, each of which records a respective one of the sets of performance parameters. In such case, the performance data selecting circuit enables one of the performance data registers as a function of the programming of the speed grade register and/or the programming of the clock speed register.

BRIEF DESCRIPTION OF THE DRAWINGS

FIGS. 3A and 3B are tables showing four different speed grade values and four different clock speed values that may be designated by the speed grade register and the clock speed register, respectively, of FIG. 2.

FIG. 4 is a logic diagram of an embodiment of a speed grade decoder and a clock speed decoder used in the speed grade register and the clock speed register of FIG. 2.

FIG. 6 is a block diagram of an embodiment of a computer system using the integrated circuit of FIG. 1.

DETAILED DESCRIPTION OF THE INVENTION

Figure 1:
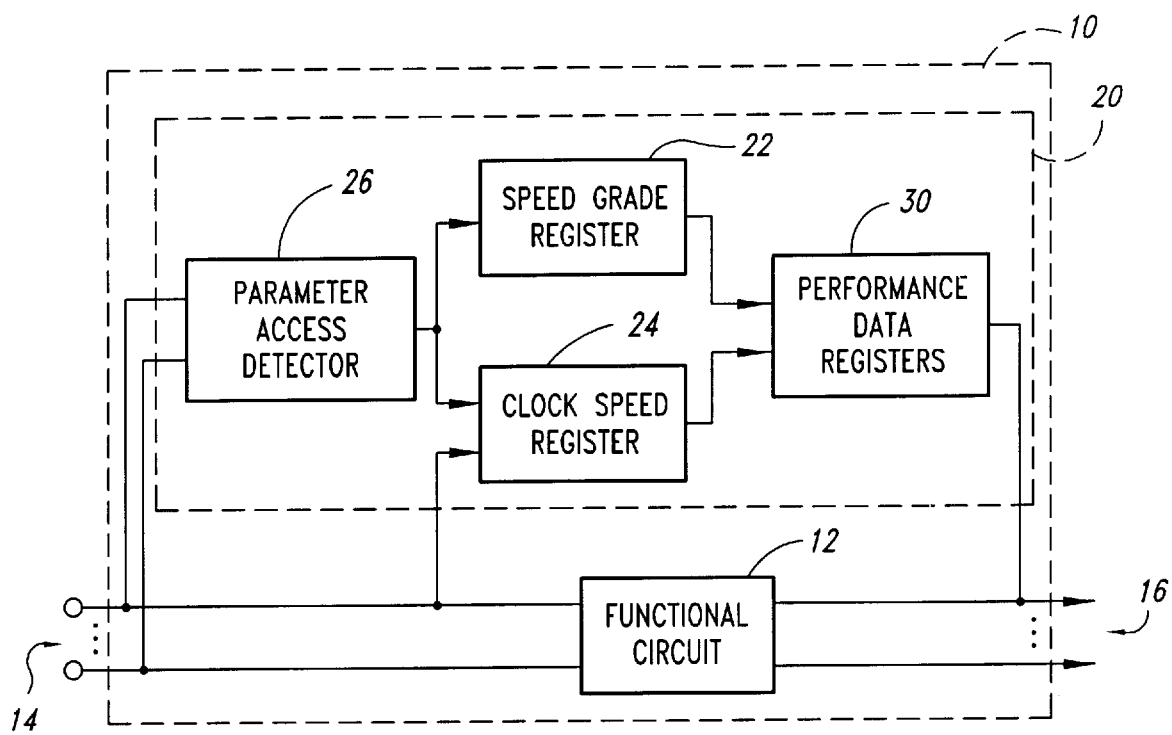
FIG. 1 is a block diagram of an integrated circuit containing a functional circuit and a preferred embodiment of a circuit for recording the performance parameters of the functional circuit.

One embodiment of an integrated circuit 10 in accordance with the method and circuit for specifying performance parameters is illustrated in FIG. 1. The integrated circuit 10 includes a functional circuit 12 that can be any of a wide variety of circuits that are conventionally fabricated as an integrated circuit. For example, the functional circuit 12 may be a memory device, such as a DRAM, synchronous DRAM, packetized DRAM, static random access memory ("SRAM"), etc. The functional circuit includes a plurality of externally accessible input terminals 14 and a plurality of externally accessible output terminals 16. However, it will be understood that the functional circuit 12 may have only input terminals 14, only output terminals 16, terminals that are used as both input and output terminals, or any combination thereof. The performance parameters for the functional circuit 12 would normally be specified in data sheets or a data book.

In accordance with one embodiment of the invention, the integrated circuit 10 also includes a circuit 20 for specifying the performance parameters of the functional circuit 12. The parameter specifying circuit 20 includes a speed grade register 22 that is normally programmed by the manufacturer during manufacture to specify the speed grade of the functional circuit 12. More specifically, during manufacture of the integrated circuit 10, the functional circuit 12 is tested while the integrated circuit 10 is still part of a wafer. Based on these tests, the speed capability of the functional circuit 12 is determined. The manufacturer then programs the register 22 with data indicative of the speed grade of the functional circuit 12. The speed grade register 22 may be of a variety of conventional registers, such as a programmable read only memory that is programmed by the manufacturer or fuses or antifuses that are blown in a pattern corresponding to the speed grade. Also, although the speed grade register 22 is preferably programmed during manufacture, it may also be programmed after manufacture by conventional means. Finally, although testing of the functional circuit 12 preferably occurs during manufacture, it may also occur after manufacture, in which case the speed grade register 22 must be programmed after manufacture.

The performance specifying circuit 20 also includes a clock speed register 24 that is adapted to be programmed by a user who has purchased the integrated circuit 10. The clock speed register 24 is programmed through the input terminals 14 with an indication of the frequency of a clock signal that will be used to synchronize the operation of the functional circuit 12. For example, the clock speed register 24 may be a two-bit register that provides an indication of whether the clock speed corresponds to 200 megabits per second ("MBPS"), 400 MBPS, 600 MBPS or 800 MBPS. The clock speed register 24 may be any of a wide variety of devices capable of storing data in a nonvolatile manner. For example, the clock speed register 24 may be a programmable read only memory ("PROM"), a flash ROM, or a programmable element, such as a fuse or antifuse.

The speed grade register 22 and the clock speed register 24 are enabled by an output from a parameter access detector circuit 26. The parameter access detector circuit 26 includes a plurality of inputs that are coupled to the input terminals 14 of the integrated circuit 10. In response to a predetermined combination of signals applied to the input terminals 14, and decoded by the parameter access detector 26, the parameter access detector 26 enables the speed grade register 22 and the clock speed register 24. The combination of signals chosen for decoding by the parameter access detector 26 is preferably a combination of signals that is not normally applied to the integrated circuit 10 during normal operation. Circuits usable for the parameter access detector 26 are conventionally used to select a special operating mode, such as a test mode, in integrated circuits.

The parameter recording system 20 also includes a plurality of performance data registers 30 that record a plurality of sets of performance parameters, with each set corresponding to a specific combination of speed grade of the integrated circuit 10 and frequency of a clock signal that is to be applied to the integrated circuit 10. Thus, for example, the performance data registers 30 record a set of performance parameters for an integrated circuit 10 having a speed grade of 30 nanoseconds that will be operated at a clock speed of 200 MBPS, a set of performance parameters for an integrated circuit having a speed grade of 30 nanoseconds at a clock speed of 400 MBPS, etc. Respective sets of performance parameters will also be recorded for, for example, integrated circuits having a speed grade of 45 nanoseconds at each clock speed from 200 MBPS to 800 MBPS. Based on the speed grade programmed into the speed grade register 22 by the manufacturer and the clock speed programmed into the clock speed register 24 by the user, the performance data register 30 applies to the output terminal 60 the data corresponding to the performance parameters at that speed grade and clock speed. The user can then read the performance parameters through the output terminals 16 to design circuitry interfacing with the functional circuit 12 in an optimum manner.

Figure 2:
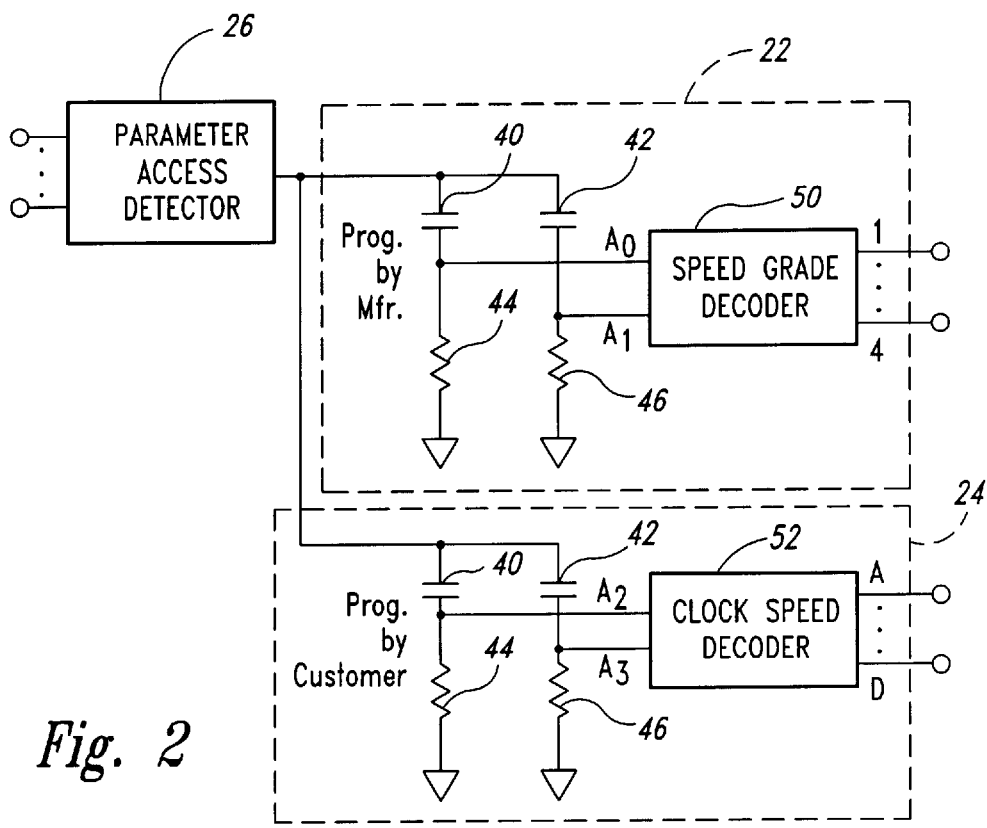
FIG. 2 is a schematic diagram showing one embodiment of a speed grade register and a clock speed register that are used in the performance parameter recording circuit of FIG. 1.

One embodiment of a speed grade register 22 and a clock speed register 24 is shown in FIG. 2 along with the parameter access detector 26. The registers 22, 24 each include a pair of antifuses 40, 42 having one plate coupled to the output of the parameter access detector 26 and the other plate coupled to ground through a resistor 44, 46, respectively. As is well-known in the art, the antifuses 40, 42 are programmed by directing sufficient current through the antifuses 40, 42 to join one plate of the antifuse to the other. Thus, the antifuses 40, 42 that are programmed are conductive, while antifuses that are not programmed are non-conductive. The circuitry used to perform this programming function is conventional and thus has not been included in the interests of brevity and clarity. The manner in which the speed grade register 22 records the speed grade of the functional circuit 12 is illustrated in the table of FIG. 3A. If neither of the antifuses 40, 42 have been programmed with a short circuit, the A0 and A1 bits of a binary number will both be "0" thereby providing an indication that the functional circuit 12 has a speed grade of 30 nanoseconds. If only the antifuse 42 has been programmed, the speed grade register 22 provides an indication that the functional circuit has a speed grade of 35 nanoseconds. If both antifuses 40, 42 are programmed, the binary number "11" output from the speed grade register 22 is indicative of a speed grade of 45 nanoseconds. As mentioned above, the speed grade register 22 and the clock speed register 24 may be implemented using a variety of nonvolatile data recording devices, in addition to the antifuses 40, 42 illustrated in FIG. 2.

The junction between each antifuse 40, 42 and its respective resistor 44, 46 is applied to a respective decoder, i.e., a speed grade decoder 50 and a clock speed decoder 52. The decoders 50, 52 decode the binary number A0, A1, A2, and A3, respectively, from the antifuses 40, 42 and drive a corresponding one of its four outputs active. Thus, for example, if the binary number is "00," the decoder 50 or 52 will output a high on its first terminal. If the binary number is "11," the decoder 50 or 52 will output a high on its last terminal.

The antifuses 40, 42 in the clock speed register 24 operate in essentially the same manner as the speed grade register 22. The user does not program either the antifuse 40, 42 if a 200 MBPS clock will be used, only the antifuse 42 is programmed if a clock speed of 400 MBPS will be used, etc.

Illustrative embodiments of the speed grade decoder 50 and the clock speed decoder 52 are illustrated in FIG. 4. As explained above, the decoders 50, 52 decode the binary signals applied to their inputs and generate an active high at one of its outputs corresponding to the binary number. Each of the decoders 50, 52 includes four NOR gates 60–66 and a pair of inverters 70, 72. The binary inputs A0 and A1 or A2 and A3 are applied to the NOR gates 60–66 either directly or through the inverter 70, 72 so that the first NOR gate 60 receives the binary inputs to decode "00," the NOR gate 62 receives the inverted A0 or A2 bit to decode "01," the NOR gate 64 receives the inverted A1 or A3 bit to decode "10," and the NOR gate 66 receives both inverted bits A0 and A1 or A2 and A3 to decode "11."

Figure 5:
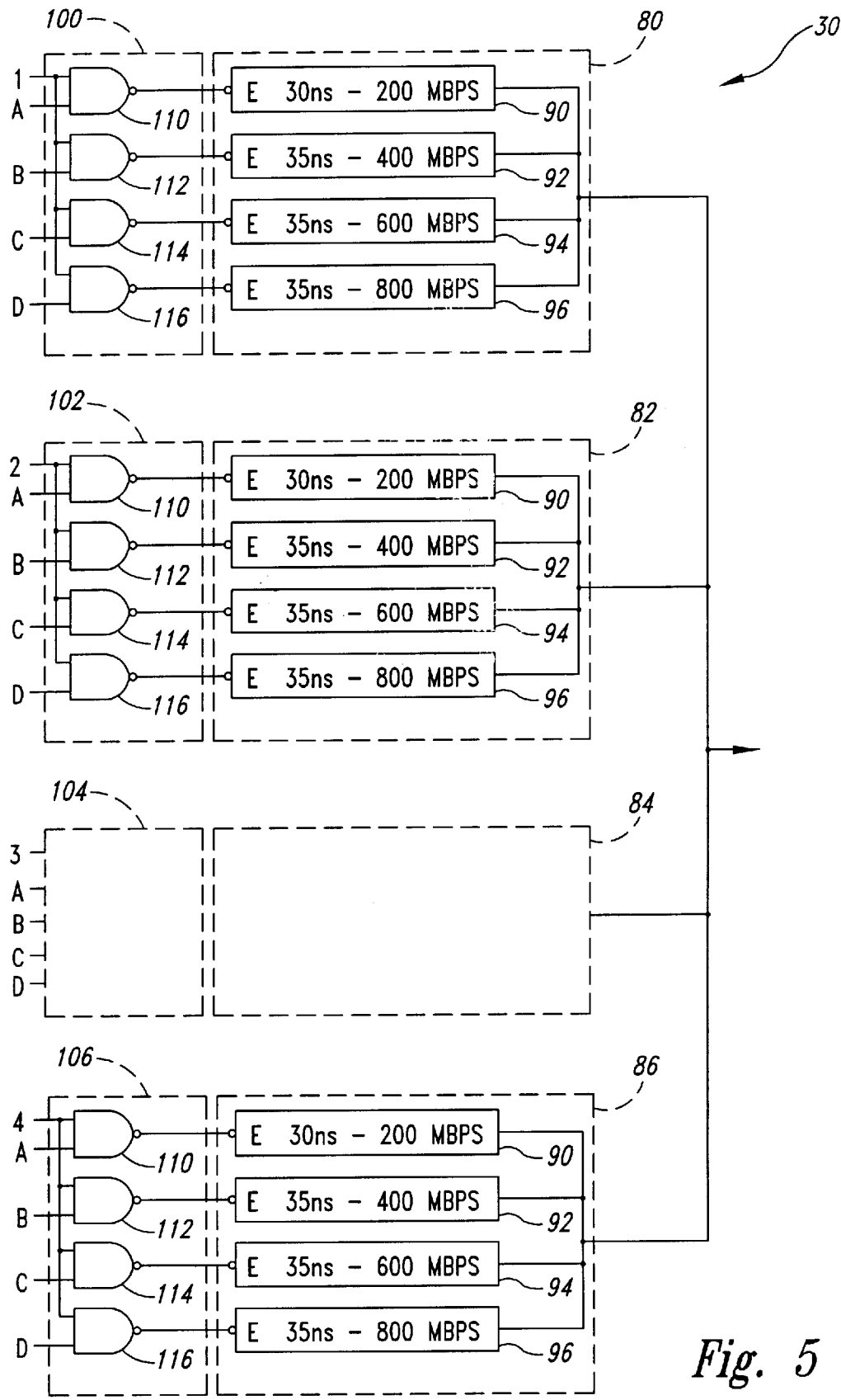
FIG. 5 is a logic diagram of an embodiment of a performance parameter data register and a data register selecting circuit that are used in the performance parameter recording circuit of FIG. 1.

One embodiment of the performance data registers 30 is illustrated in FIG. 5. The performance data registers include four register sets 80–86 each of which include four registers 90–96. Each register set 80–86 records the performance parameters for a respective speed grade. Thus, for example, the register set 82 records the performance parameters for a 35 nanosecond speed grade. Each of the registers 90, 96 records the performance parameters for a respective clock speed within the speed grade. Thus, within the register set 80, the register 90 records the performance parameters for a 30 nanosecond speed grade at a clock speed of 200 MBPS, the register 92 records the performance parameters for a 30 nanosecond speed grade at a clock speed of 400 MBPS, the register 94 records the performance parameters for a 30 nanosecond speed grade at a clock speed of 600 MBPS, and the register 96 records the performance parameters for a 30 nanosecond speed grade at a clock speed of 800 MBPS. Each of the registers 90, 96 has a data output that are coupled to each other and a respective enable input.

The enable inputs for the registers 90–96 in each register set 80–86 is coupled to a respective selector circuit 100–106. The selector circuits 100–106 are coupled to the outputs of the speed grade decoder 50 and the clock speed decoder 52. (The outputs of the speed grade decoder 50 are designated by the numbers 1–4, and the outputs of the clock speed decoder 52 are designated by the letters A–D). Each of the decoder circuits 100–106 includes four NAND gates 110–116. All of the NAND gates 110–116 in each selector circuit 90 are simultaneously enabled by an active high from one of the outputs of the speed grade decoder 50. Thus, the NAND gates 110–116 in the selector circuit 100 are all enabled by an active high "1" output from the speed grade decoder 50 indicative of a 30 nanosecond speed grade. Similarly, all of the NAND gates 110–116 in the selector circuit 106 are enabled by an active high on the "4" output of the speed grade decoder 50 indicative of a 45 nanosecond speed grade. Individual NAND gates 110–116 within each selector circuit 100–106 are enabled by a respective output from the clock speed decoder 52. Thus, for example, the NAND gates 110 are enabled by an active high "A" output from the clock speed decoder 52 indicative of a clock speed of 200 MBPS. As a result, when the speed grade decoder 50 outputs an active high signal on output "2" indicative of a 35 nanosecond speed grade and the clock speed decoder 52 outputs an active high signal on the "C" output indicative of a 600 MBPS clock speed, the NAND gate 114 in the selection circuit 102 outputs a low. The low at the output of the NAND gate 114 enables the register 94 in the register set 82 which then outputs data indicative of the performance parameters at a 35 nanosecond speed grade and a clock speed of 600 MBPS. The performance parameters are then read by the user, as explained above.

FIG. 6 is a block diagram of a computer system 200 that includes the integrated circuit 10 of FIG. 1 in which the functional circuit 12 is a memory device. The computer system 200 includes computer circuitry 202, such as a processor, for performing various computing functions, such as executing specific software to perform specific calculations or tasks. Included in the computer circuitry 202 is the integrated circuit 10 containing the memory device as the functional circuit 12. In addition, the computer system 200 includes one or more input devices 204, such as a keyboard or a mouse, coupled to the computer circuitry 202 to allow an operator to interface with the computer system 200. Typically, the computer system 200 also includes one or more output devices 210 coupled to the computer circuitry 202, such output devices typically being a printer or a video terminal. One or more data storage devices 212 are also typically coupled to the computer circuitry 202 to store data or retrieve data from external storage media (not shown). Examples of typical storage devices 212 include hard and floppy disks, tape cassettes, and compact disc read-only memories (CD-ROMs). The computer circuitry 202 is typically coupled to the memory device 12 through a control bus, a data bus, and an address bus to provide for writing data to and reading data from the memory device 12.

While the invention has been described herein by way of exemplary embodiments for purposes of illustration, various modifications may be made without departing from the spirit and scope of the invention. Accordingly, the invention is not limited except as by the appended claims.

What is claimed is:

1. In an integrated circuit including a performance specifying circuit and a functional circuit that is adapted to operate with a clock signal, the performance specifying circuit comprising:
   a speed grade register programmable to specify a speed performance capability of the functional circuit;
   a clock speed register programmable to specify the frequency of the clock signal that will be applied to the functional circuit during operation of the functional circuit;
   a performance data recording circuit recording a plurality of sets of performance parameters of the functional circuit, the performance parameters in each set being specified for a respective combination of speed performance capabilities and frequencies of the clock signal; and
   a performance data selecting circuit coupled to the speed grade register, the clock speed register, and the performance data recording circuit, the performance data selecting circuit being operable to select one of the sets of recorded performance parameters as a function of the programming of the speed grade register and the programming of the clock speed register.

2. The performance specifying circuit of claim 1 wherein the speed grade register comprises a plurality of programmable elements having respective conductive states programmed during manufacture of the integrated circuit, the programmable elements being programmed in a pattern corresponding to one of a plurality of speed grades of the functional circuit.

3. The performance specifying circuit of claim 2 further comprising a decoder coupled to each of the programmable elements, the decoder being operable to decode the programmed pattern of the programmable elements and generate an output signal corresponding thereto.

4. The performance specifying circuit of claim 2 wherein the programmable elements comprises respective anti-fuses.

5. The performance specifying circuit of claim 1 wherein the clock speed register comprises a plurality of programmable elements having respective conductive states externally programmed after manufacture of the integrated circuit, the programmable elements being programmed in a pattern corresponding to one of a plurality of frequencies of the clock signal that may be applied to the functional circuit during operation of the functional circuit.

6. The performance specifying circuit of claim 5 further comprising a decoder coupled to each of the programmable elements, the decoder being operable to decode the programmed pattern of the programmable elements and generate an output corresponding thereto.

7. The performance specifying circuit of claim 5 wherein the programmable elements comprises respective anti-fuses.

8. The performance specifying circuit of claim 1 further comprising a parameter read mode detector having a plurality of externally accessible input terminals, the read mode detector being operable to activate the performance specifying circuit to select one of the sets of recorded performance parameters responsive to a predetermined set of respective signals applied to the input terminals.

9. The performance specifying circuit of claim 1 wherein the performance data recording circuit comprises a plurality of performance data registers each of which records a respective one of the sets of performance parameters, the performance data selecting circuit being operable to enable one of the performance data registers as a function of the programming of the speed grade register and the programming of the clock speed register.

10. The performance specifying circuit of claim 1 wherein the performance data recording circuit comprises a plurality of sets of performance data registers, each set of performance data registers recording the performance parameters of the functional circuit at a respective speed grade at a plurality of frequencies of the clock signal, one of the sets of performance data registers being selected by the performance data selecting circuit as a function of the programming of the speed grade register, and one of the performance data registers within the selected set being enabled by the performance data selecting circuit as a function of the programming of the clock speed register.

11. The performance specifying circuit of claim 1 wherein the functional circuit comprises a memory device.

12. A memory system comprising:
    a memory device;
    a speed grade register programmable to specify a speed performance capability of the memory device;
    a clock speed register programmable to specify the frequency of a clock signal that will be applied to the memory device;
    a performance data recording circuit recording a plurality of sets of performance parameters of the memory device, the performance parameters in each set being specified for a respective combination of speed performance capabilities and frequencies of the clock signal; and
    a performance data selecting circuit coupled to the speed grade register, the clock speed register, and the performance data recording circuit, the performance data selecting circuit being operable to select one of the sets of recorded performance parameters as a function of the programming of the speed grade register and the programming of the clock speed register.

13. The memory system of claim 12 wherein the speed grade register comprises a plurality of programmable elements having respective conductive states programmed during manufacture of the integrated circuit, the programmable elements being programmed in a pattern corresponding to one of a plurality of speed grades of the memory device.

14. The memory system of claim 13 further comprising a decoder coupled to each of the programmable elements, the decoder being operable to decode the programmed pattern of the programmable elements and generate an output signal corresponding thereto.

15. The memory system of claim 13 wherein the programmable elements comprises respective anti-fuses.

16. The memory system of claim 12 wherein the clock speed register comprises a plurality of programmable elements having respective conductive states externally programmed after manufacture of the integrated circuit, the programmable elements being programmed in a pattern corresponding to one of a plurality of frequencies of the clock signal that may be applied to the memory device during operation of the memory device.

17. The memory system of claim 16 further comprising a decoder coupled to each of the programmable elements, the decoder being operable to decode the programmed pattern of the programmable elements and generate an output corresponding thereto.

18. The memory system of claim 16 wherein the programmable elements comprises respective anti-fuses.

19. The memory system of claim 12 further comprising a parameter read mode detector having a plurality of externally accessible input terminals, the read mode detector being operable to activate the performance specifying circuit to select one of the sets of recorded performance parameters responsive to a predetermined set of respective signals applied to the input terminals.

20. The memory system of claim 12 wherein the performance data recording circuit comprises a plurality of performance data registers each of which records a respective one of the sets of performance parameters, the performance data selecting circuit being operable to enable one of the performance data registers as a function of the programming of the speed grade register and the programming of the clock speed register.

21. The memory system of claim 12 wherein the performance data recording circuit comprises a plurality of sets of performance data registers, each set of performance data registers recording the performance parameters of the memory device at a respective speed grade at a plurality of frequencies of the clock signal, one of the sets of performance data registers being selected by the performance data selecting circuit as a function of the programming of the speed grade register, and one of the performance data registers within the selected set being enabled by the performance data selecting circuit as a function of the programming of the clock speed register.

22. The memory system of claim 12 wherein the memory device comprises a dynamic random access memory device.

23. In an integrated circuit including a performance specifying circuit and a functional circuit, the performance specifying circuit comprising:
  a speed grade register to specify a speed performance capability of the functional circuit;
  a performance data recording circuit recording a plurality of sets of performance parameters of the functional circuit, the performance parameters in each set being specified for a respective one of a plurality of speed performance capabilities; and
  a performance data selecting circuit coupled to the speed grade register, the performance data selecting circuit being operable to select one of the sets of recorded performance parameters as a function of the programming of the speed grade register.

24. The performance specifying circuit of claim 23 wherein the speed grade register comprises a plurality of programmable elements having respective conductive states programmed during manufacture of the integrated circuit, the programmable elements being programmed in a pattern corresponding to one of a plurality of speed grades of the functional circuit.

25. The performance specifying circuit of claim 24 further comprising a decoder coupled to each of the programmable elements, the decoder being operable to decode the programmed pattern of the programmable elements and generate an output signal corresponding thereto.

26. The performance specifying circuit of claim 24 wherein the programmable elements comprises respective anti-fuses.

27. The performance specifying circuit of claim 23 further comprising a parameter read mode detector having a plurality of externally accessible input terminals, the read mode detector being operable to activate the performance specifying circuit to select one of the sets of recorded performance parameters responsive to a predetermined set of respective signals applied to the input terminals.

28. The performance specifying circuit of claim 23 wherein the performance data recording circuit comprises a plurality of performance data registers each of which records a respective one of the sets of performance parameters, the performance data selecting circuit being operable to enable one of the performance data registers as a function of the programming of the speed grade register.

29. The performance specifying circuit of claim 23 wherein the functional circuit comprises a memory device.

30. In an integrated circuit including a performance specifying circuit and a functional circuit that is adapted to operate with a clock signal, the performance specifying circuit comprising:
  a clock speed register programmable to specify the frequency of the clock signal that will be applied to the functional circuit during operation of the functional circuit;
  a performance data recording circuit recording a plurality of sets of performance parameters of the functional circuit, the performance parameters in each set being specified for a respective one of a plurality of frequencies of the clock signal; and
  a performance data selecting circuit coupled to the clock speed register and the performance data recording circuit, the performance data selecting circuit being operable to select one of the sets of recorded performance parameters as a function of the programming of the programming of the clock speed register.

31. The performance specifying circuit of claim 30 wherein the clock speed register comprises a plurality of programmable elements having respective conductive states externally programmed after manufacture of the integrated circuit, the programmable elements being programmed in a pattern corresponding to one of a plurality of frequencies of the clock signal that may be applied to the functional circuit during operation of the functional circuit.

32. The performance specifying circuit of claim 31 further comprising a decoder coupled to each of the programmable elements, the decoder being operable to decode the programmed pattern of the programmable elements and generate an output corresponding thereto.

33. The performance specifying circuit of claim 31 wherein the programmable elements comprises respective anti-fuses.

34. The performance specifying circuit of claim 30 further comprising a parameter read mode detector having a plurality of externally accessible input terminals, the read mode detector being operable to activate the performance specifying circuit to select one of the sets of recorded performance parameters responsive to a predetermined set of respective signals applied to the input terminals.

35. The performance specifying circuit of claim 30 wherein the performance data recording circuit comprises a plurality of performance data registers each of which records a respective one of the sets of performance parameters, the performance data selecting circuit being operable to enable one of the performance data registers as a function of the programming of the clock speed register.

36. The performance specifying circuit of claim 30 wherein the functional circuit comprises a memory device.

37. A computer system, comprising:
  a clock circuit generating a clock signal;
  a processor coupled to the clock circuit to receive the clock signal, the processor having a processor bus;
  an input device coupled to the processor through the processor bus adapted to allow data to be entered into the computer system;
  an output device coupled to the processor through the processor bus adapted to allow data to be output from the computer system; and a memory device coupled to the clock circuit and the processor to allow data to be read from the memory device by the processor and to allow data to be written to the memory device by the processor, the memory device including a performance specifying circuit comprising:

an array of memory cells arranged in rows and columns, the array including a pair of complimentary digit lines for each column of the array;

a row address decoder for selecting a row of memory cells corresponding to a row address;

a column address decoder for selecting a column of memory cells corresponding to a column address;

a data path coupled to an external data terminal of the memory device;

a command decoder operable to generate control signals responsive to memory commands applied to the memory device;

a speed grade register programmable to specify a speed performance capability of the memory device;

a clock speed register programmable to specify the frequency of a clock signal that will be applied to the memory device;

a performance data recording circuit recording a plurality of sets of performance parameters of the memory device, the performance parameters in each set being specified for a respective combination of speed performance capabilities and frequencies of the clock signal; and a performance data selecting circuit coupled to the speed grade register, the clock speed register, and the performance data recording circuit, the performance data selecting circuit being operable to select one of the sets of recorded performance parameters as a function of the programming of the speed grade register and the programming of the clock speed register.

38. The computer system of claim 37 wherein the speed grade register comprises a plurality of programmable elements having respective conductive states programmed during manufacture of the integrated circuit, the programmable elements being programmed in a pattern corresponding to one of a plurality of speed grades of the memory device.

39. The computer system of claim 38 further comprising a decoder coupled to each of the programmable elements, the decoder being operable to decode the programmed pattern of the programmable elements and generate an output signal corresponding thereto.

40. The computer system of claim 38 wherein the programmable elements comprises respective anti-fuses.

41. The computer system of claim 37 wherein the clock speed register comprises a plurality of programmable elements having respective conductive states externally programmed after manufacture of the integrated circuit, the programmable elements being programmed in a pattern corresponding to one of a plurality of frequencies of the clock signal that may be applied to the memory device during operation of the memory device.

42. The computer system of claim 41 further comprising a decoder coupled to each of the programmable elements, the decoder being operable to decode the programmed pattern of the programmable elements and generate an output corresponding thereto.

43. The computer system of claim 41 wherein the programmable elements comprises respective anti-fuses.

44. The computer system of claim 37 further comprising a parameter read mode detector having a plurality of externally accessible input terminals, the read mode detector being operable to activate the performance specifying circuit to select one of the sets of recorded performance parameters responsive to a predetermined set of respective signals applied to the input terminals.

45. The computer system of claim 37 wherein the performance data recording circuit comprises a plurality of performance data registers each of which records a respective one of the sets of performance parameters, the performance data selecting circuit being operable to enable one of the performance data registers as a function of the programming of the speed grade register and the programming of the clock speed register.

46. The computer system of claim 37 wherein the performance data recording circuit comprises a plurality of sets of performance data registers, each set of performance data registers recording the performance parameters of the memory device at a respective speed grade at a plurality of frequencies of the clock signal, one of the sets of performance data registers being selected by the performance data selecting circuit as a function of the programming of the speed grade register, and one of the performance data registers within the selected set being enabled by the performance data selecting circuit as a function of the programming of the clock speed register.

47. The computer system of claim 37 wherein the memory device comprises a dynamic random access memory device.

48. A method of recording and outputting performance parameters of an integrated circuit that is adapted to operate with a clock signal that may have one of a plurality of clock frequencies, the method comprising:

determining at least one speed parameter of the integrated circuit;

recording a speed grade value of the integrated circuit, the speed grade value corresponding to the determined speed parameter;

determining the frequency of the clock signal;

recording a clock speed value in the integrated circuit, the clock speed value corresponding to the determined frequency of the clock signal;

recording in the integrated circuit a plurality of sets of performance parameters of the integrated circuit, the performance parameters in each set being specified for a respective combination of speed grade values and frequencies of the clock signal;

selecting one of the sets of recorded performance parameters as a function of the recorded speed grade value and the recorded clock speed value; and outputting the selected set of performance parameters.

49. The method of claim 48 wherein the act of determining at least one speed parameter comprises testing the integrated circuit.

50. The method of claim 48 wherein the act of recording a speed grade value in the integrated circuit comprises recording a speed grade value in the integrated circuit during manufacture of the integrated circuit.

51. The method of claim 48 wherein the act of recording a clock speed value in the integrated circuit comprises recording the clock speed value in the integrated circuit after manufacture of the integrated circuit.

52. The method of claim 48 wherein the act of recording in the integrated circuit a plurality of sets of performance parameters of the integrated circuit comprises recording a plurality of sets of performance parameters during manufacture of the integrated circuit.

53. A method of recording and outputting performance parameters of an integrated circuit, the method comprising:

determining at least one speed parameter of the integrated circuit;

recording a speed grade value in the integrated circuit, the speed grade value corresponding to the determined speed parameter;

recording in the integrated circuit a plurality of sets of performance parameters of the integrated circuit, the performance parameters in each set being specified for a respective one of a plurality of speed grades;

selecting one of the sets of recorded performance parameters as a function of the recorded speed grade value; and outputting the selected set of performance parameters.

54. The method of claim 53 wherein the act of determining at least one speed parameter comprises testing the integrated circuit.

55. The method of claim 54 wherein the act of recording a speed grade value in the integrated circuit comprises recording a speed grade value in the integrated circuit during manufacture of the integrated circuit.

56. The method of claim 53 wherein the act of recording in the integrated circuit a plurality of sets of performance parameters of the integrated circuit comprises recording a plurality of sets of performance parameters during manufacture of the integrated circuit.

57. A method of recording and outputting performance parameters of an integrated circuit that is adapted to operate with a clock signal that may have one of a plurality of clock frequencies, the method comprising:

determining the frequency of the clock signal;

recording a clock speed value in the integrated circuit, the clock speed value corresponding to the determined frequency of the clock signal;

recording in the integrated circuit a plurality of sets of performance parameters of the integrated circuit, the performance parameters in each set being specified for a respective one of a plurality of frequencies of the clock signal;

selecting one of the sets of recorded performance parameters as a function of the recorded clock speed value; and outputting the selected set of performance parameters.

58. The method of claim 57 wherein the act of recording a clock speed value in the integrated circuit comprises recording the clock speed value in the integrated circuit after manufacture of the integrated circuit.

59. The method of claim 57 wherein the act of recording in the integrated circuit a plurality of sets of performance parameters of the integrated circuit comprises recording a plurality of sets of performance parameters during manufacture of the integrated circuit.

* * * * *